US007821285B2

(12) United States Patent
Kawaura et al.

(10) Patent No.: US 7,821,285 B2
(45) Date of Patent: Oct. 26, 2010

(54) LIQUID CRYSTAL DISPLAY APPARATUS AND TESTING METHOD FOR LIQUID CRYSTAL DISPLAY APPARATUS

(75) Inventors: Hideaki Kawaura, Kanagawa (JP); Kazutoshi Shimizume, Kanagawa (JP); Naoki Ando, Kanagawa (JP); Kazuyuki Miyazawa, Nagasaki (JP); Katsuhisa Hirano, Nagasaki (JP); Noriaki Horiguchi, Kanagawa (JP); Osamu Akimoto, Tokyo (JP)

(73) Assignee: Sony Corporation, Tokyo (JP)

( * ) Notice: Subject to any disclaimer, the term of this patent is extended or adjusted under 35 U.S.C. 154(b) by 761 days.

(21) Appl. No.: 11/811,774

(22) Filed: Jun. 12, 2007

(65) Prior Publication Data

US 2008/0007504 A1 Jan. 10, 2008

(30) Foreign Application Priority Data

Jun. 13, 2006 (JP) ............................ 2006-162991

(51) Int. Cl.
*G01R 31/00* (2006.01)

(52) U.S. Cl. ..................................................... 324/770

(58) Field of Classification Search .................. 324/770
See application file for complete search history.

(56) References Cited

U.S. PATENT DOCUMENTS

2004/0141131 A1* 7/2004 Ishikawa et al. ............ 349/139
2005/0200377 A1* 9/2005 Orii et al. .................... 324/770
2006/0192752 A1* 8/2006 Ando ......................... 345/156

FOREIGN PATENT DOCUMENTS

JP 2004-226551 8/2004

* cited by examiner

*Primary Examiner*—Roberto Velez
(74) *Attorney, Agent, or Firm*—Frommer Lawrence & Haug LLP; William S. Frommer

(57) ABSTRACT

Disclosed herein is a liquid crystal display apparatus, including, a pixel array section, a first data line, a second data line, a writing unit, a voltage supply control unit, a data line short-circuiting unit, a reading out unit, and a testing unit.

6 Claims, 6 Drawing Sheets

LIQUID CRYSTAL DISPLAY APPARATUS AND TESTING METHOD FOR LIQUID CRYSTAL DISPLAY APPARATUS

CROSS REFERENCES TO RELATED APPLICATIONS

The present invention contains subject matter related to Japanese Patent Application JP 2005-162991 filed in the Japan Patent Office on Jun. 13, 2006, the entire contents of which being incorporated herein by reference.

BACKGROUND OF THE INVENTION

1. Field of the Invention

This invention relates to a liquid crystal display apparatus and a testing method for a liquid crystal display apparatus.

2. Description of the Related Art

In recent years, reduction of the thickness of apparatus has and is being proceeded rapidly in the field of display apparatus. As thin display apparatus, typically a liquid crystal display (LCD) apparatus has spread widely. The liquid crystal display apparatus is advantageous in that it is thin in thickness, light in weight and low in power consumption, and therefore is frequently used particularly in mobile apparatus such as personal digital assistants (PDA), notebook type personal computers (PC) and portable television receivers. The liquid crystal display apparatus is utilized not only in such mobile apparatus but also in home use television receivers, projectors and so forth.

While an active matrix type and a passive matrix type are available as driving types for a liquid crystal display apparatus, a liquid crystal display apparatus of the active matrix type has become the mainstream in recent years. A liquid crystal display apparatus of the active matrix type has a panel structure wherein two substrates are disposed in an opposing relationship to each other and liquid crystal is filled between the substrates. One of the two substrates has transparent pixel electrodes and thin film transistors (TFTs) formed thereon and is hereinafter referred to as TFT substrate. The other substrate has a single transparent electrode formed on an overall display area thereof and is hereinafter referred to as opposing substrate.

In the active matrix liquid crystal display apparatus, a TFT serving as a switching element is controlled for switching between on and off states for each of pixels disposed two-dimensionally in a matrix to apply a voltage (hereinafter referred to as "gradation voltage") in accordance with a gradation to the pixel electrode. As a result, a potential difference is produced between the pixel electrode and the electrode on the opposing substrate thereby to vary the transmission factor of the liquid crystal. This is the principle of the liquid crystal display.

On the TFT substrate, a plurality of data lines for supplying a gradation voltage to the pixel electrodes and a plurality of gate lines for applying a control signal for switching the TFTs to the gate of the TFTs are wired in a matrix. Within one frame period of image display, the pixels arranged in a matrix are successively selected in a unit of a column through the gate lines, and a gradation voltage is applied to the pixel electrodes selected in this manner through the data lines thereby to display an image. A gradation voltage applied to each pixel electrode is retained by a capacitive element connected to the output electrode of the TFT until a next gradation voltage is applied.

A liquid crystal display apparatus is frequently formed as a transmission type liquid crystal display apparatus wherein a backlight disposed on the rear side of a liquid crystal panel is used as a light source to irradiate light on the liquid crystal panel from the back side to display an image. On the other hand, a reflection type liquid crystal display apparatus such as an LCOS (Liquid Crystal On Silicon) liquid crystal display apparatus has begun to be placed into the market recently. Since the LCOS liquid crystal display apparatus allows use of a silicon wafer as a substrate, it is advantageous in that transistors having higher performances can be used when compared with transmission type liquid crystal display apparatus wherein circuits are formed from polycrystalline silicon on a glass substrate.

Incidentally, at a stage of fabrication of such liquid crystal display apparatus as described above, a large number of pixels disposed two-dimensionally in a matrix sometimes include a pixel which is rendered defective by some factor. If the number of such defective pixels is excessively great, then normal image display is disturbed. Accordingly, before shipment of a liquid crystal display apparatus, it should be tested in regard to defective pixels. In the testing of pixels, the liquid crystal panel is actually driven, and a display image then is analyzed using an image processing apparatus or is observed by direct visual inspection to decide whether or not the pixels are defective.

SUMMARY OF THE INVENTION

However, such testing methods require much time because the decision regarding the pixels is performed after the liquid crystal panel is actually driven to display an image. Further, the testing methods do not allow the testing regarding pixels to be performed before liquid crystal is filled into the gap between the TFT substrate and the opposing substrate.

Also a method is applied wherein an LSI tester is used to measure leak current to decide whether or not pixels are defective. The method permits measurement of leak current down to the level of μA. However, in reflection type liquid crystal display apparatus such as LCOS liquid crystal display apparatus, the capacitance value of the capacitive element connected to the output terminal of a TFT is approximately several tens fF (femto-farad). Thus, for example, where the specification is such that a signal of 10 V is retained for 10 msec by a capacitive element of 50 FF, it is necessary to measure leak current less than 50 pA. Accordingly, the method of measuring leak current using an LSI tester fails to test pixels to decide whether the pixels are defective or non-defective.

Therefore, the following method is disclosed, for example, in Japanese Patent Laid-Open No. 2004-226551 (hereinafter referred to as Patent Document 1). In particular, different voltages are written into pixels paired with each other, and the same voltage is applied as a reference voltage to all data lines to precharge the pixels. Thereafter, the voltages retained in the paired pixels are read out to the data lines and compared with each other to decide whether or not the pixels are defective.

However, in the method disclosed in Patent Document 1, when a reference voltage is precharged into the data lines, if the reference voltage is merely precharged, the potentials at two data lines corresponding to paired pixels cannot be made equal to each other from an influence of the parasitic capacitance of the data lines and so forth although the same voltage is applied as the reference voltage. Therefore, the method has a problem in that, when the voltages retained in paired pixels are read out to two data lines and compared with each other, the comparison operation and hence the decision of the pixels in regard to whether they are defective or non-defective cannot be performed accurately.

Therefore, it is demanded to provide a liquid crystal display apparatus and a testing method for a liquid crystal display apparatus wherein, when voltages retained in paired pixels are read out to two data lines and compared with each other, the comparison operation of the voltages can be performed accurately.

According to an embodiment of the present invention, there is provided a liquid crystal display apparatus including a pixel array section including a plurality of unit pixels disposed in a matrix and each including a pixel transistor, a capacitive element connected to an output electrode of the pixel transistor and a liquid crystal cell configured to display a gradation in accordance with a voltage retained in the capacitive element, a first data line connected to an input electrode of each unit pixel of first pixel group in a unit of a pixel column from among the unit pixels of the pixel array section, a second data line connected to an input electrode of each unit pixel of second pixel group in a unit of a pixel column from among the unit pixels of the pixel array section, a writing unit for writing a first measurement signal into the unit pixels of the first pixel groups through the first data lines and writing a second measurement signal into the unit pixels of the second pixel groups through the second data lines, a voltage supply control unit for selectively supplying a predetermined dc voltage to the first and second data lines, a data line short-circuiting unit for short-circuiting the first data lines and the second data lines after the voltage supply by the voltage supply control unit, a reading out unit for reading out the first and second measurement signals from the unit pixels of the first and second pixel groups into the first and second data lines, respectively, after the first and second data lines are short-circuited to each other by the data line short-circuiting unit, and a testing unit for comparing the potentials at the first data lines and the potentials at the second data lines with each other after the reading out by the reading out unit and performing a test of the pixel array section based on a result of the comparison.

According to another embodiment of the present invention, there is provided a testing method for a liquid crystal display apparatus which includes a pixel array section including a plurality of unit pixels disposed in a matrix and each including a pixel transistor, a capacitive element connected to an output electrode of the pixel transistor and a liquid crystal cell configured to display a gradation in accordance with a voltage retained in the capacitive element, a first data line connected to an input electrode of each unit pixel of first pixel group in a unit of a pixel column from among the unit pixels of the pixel array section, and a second data line connected to an input electrode of each unit pixel of second pixel group in a unit of a pixel column from among the unit pixels of the pixel array section including the steps of, writing a first measurement signal into the unit pixels of the first pixel groups through the first data lines and writing a second measurement signal into the unit pixels of the second pixel groups through the second data lines, selectively supplying a predetermined dc voltage to the first and second data lines after the first and second measurement signals are written at the writing step, short-circuiting the first data lines and the second data lines after the voltage supply at the voltage supply control step, reading out the first and second measurement signals from the unit pixels of the first and second pixel groups into the first and second data lines, respectively, after the first and second data lines are short-circuited to each other at the short-circuiting step, and testing by comparing the potentials at the first data lines and the potentials at the second data lines with each other after the reading out at the reading out step and performing a test of the pixel array section based on a result of the comparison.

With the liquid crystal display apparatus and the testing method for a liquid crystal display apparatus, while the potentials at the first and second data lines are set equal to each other, first and second measurement signals are read out from the unit pixels of the first and second pixel groups into the first and second data lines, respectively. Then, the potentials at the data lines paired with each other are compared with each other. Consequently, the comparison operation can be performed with certainty.

DETAILED DESCRIPTION OF THE PREFERRED EMBODIMENT

Figure 1:
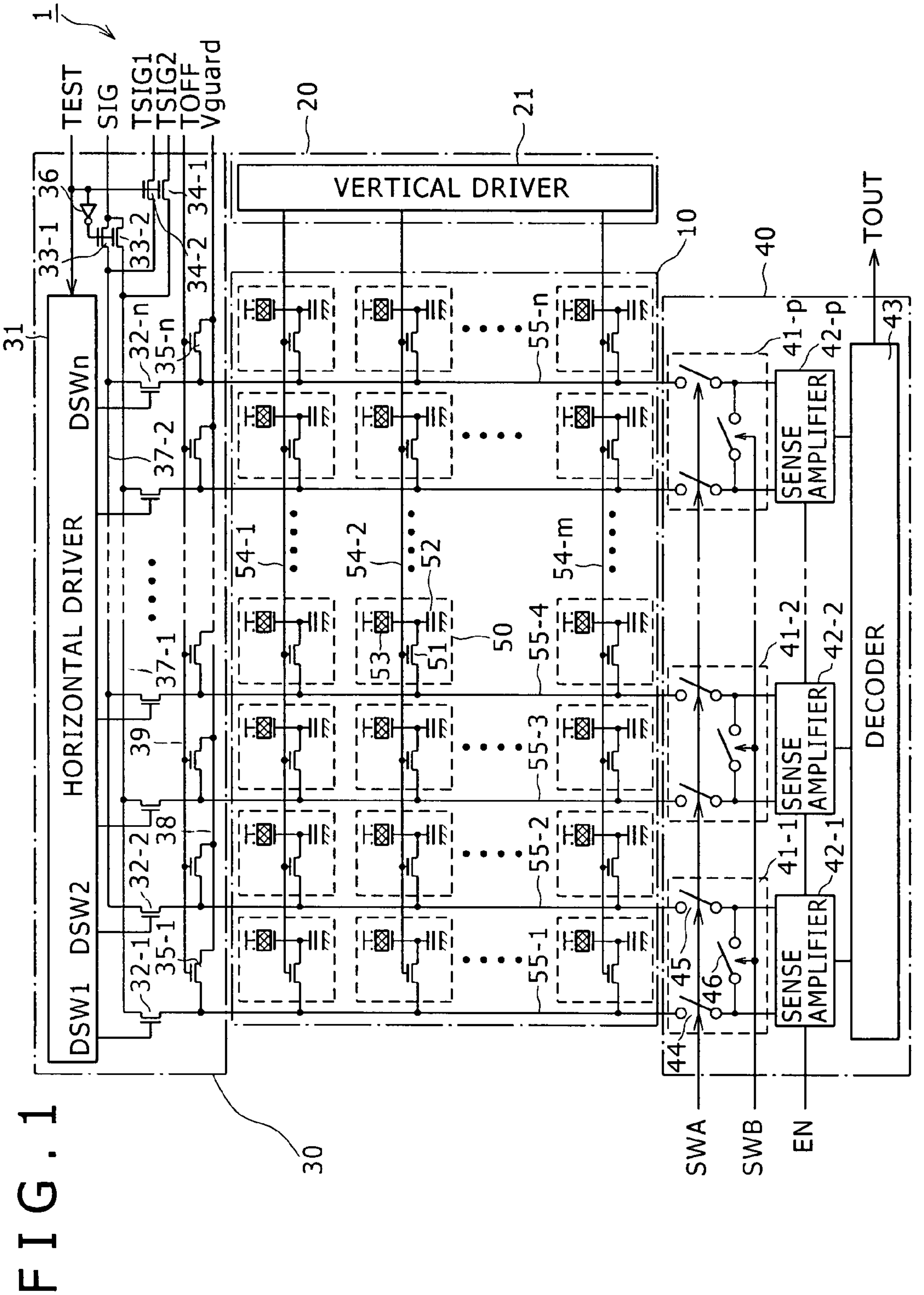
FIG. 1 is a block diagram showing a general system configuration of a liquid crystal display apparatus to which an embodiment of the present invention is applied.

Referring first to FIG. 1, there is shown a configuration of a liquid crystal display apparatus to which an embodiment of the present invention is applied. The liquid crystal display apparatus 1 shown adopts the active matrix type drive system and includes a pixel array section 10, a gate line drive circuit 20, a data line drive circuit 30, and a testing circuit 40. The liquid crystal display apparatus 1 has an ordinary operation mode in which it performs ordinary image display and a test mode in which testing of unit pixels, gate lines and data lines in regard to whether they are defective or non-defective can be performed.

Though not shown, the liquid crystal display apparatus 1 is structured such that two substrates at least one of which is transparent are disposed in an opposing relationship to each other and liquid crystal is filled between the two substrates. Unit pixels divided in a matrix are provided on the surface of at least one of the substrates, and an electrode (pixel electrode) is disposed for each of the unit pixels.

<Pixel Array Section>

The pixel array section 10 includes a large number of unit pixels 50 arranged two-dimensionally in a matrix of m rows and n columns. Each of the unit pixels 50 includes a pixel transistor 51, a capacitive element 52 connected to an output electrode of the pixel transistor 51, and a liquid crystal cell 53 for performing gradation display in response to a voltage retained by the capacitive element 52. For the pixel array of m rows and n columns of the pixel array section 10, gate lines 54-1 to **54-*m* are wired for the individual pixel rows, and data lines 55-1 to 55-*n*** are wired for the individual pixel columns.

<Unit Pixel>

Figure 2:
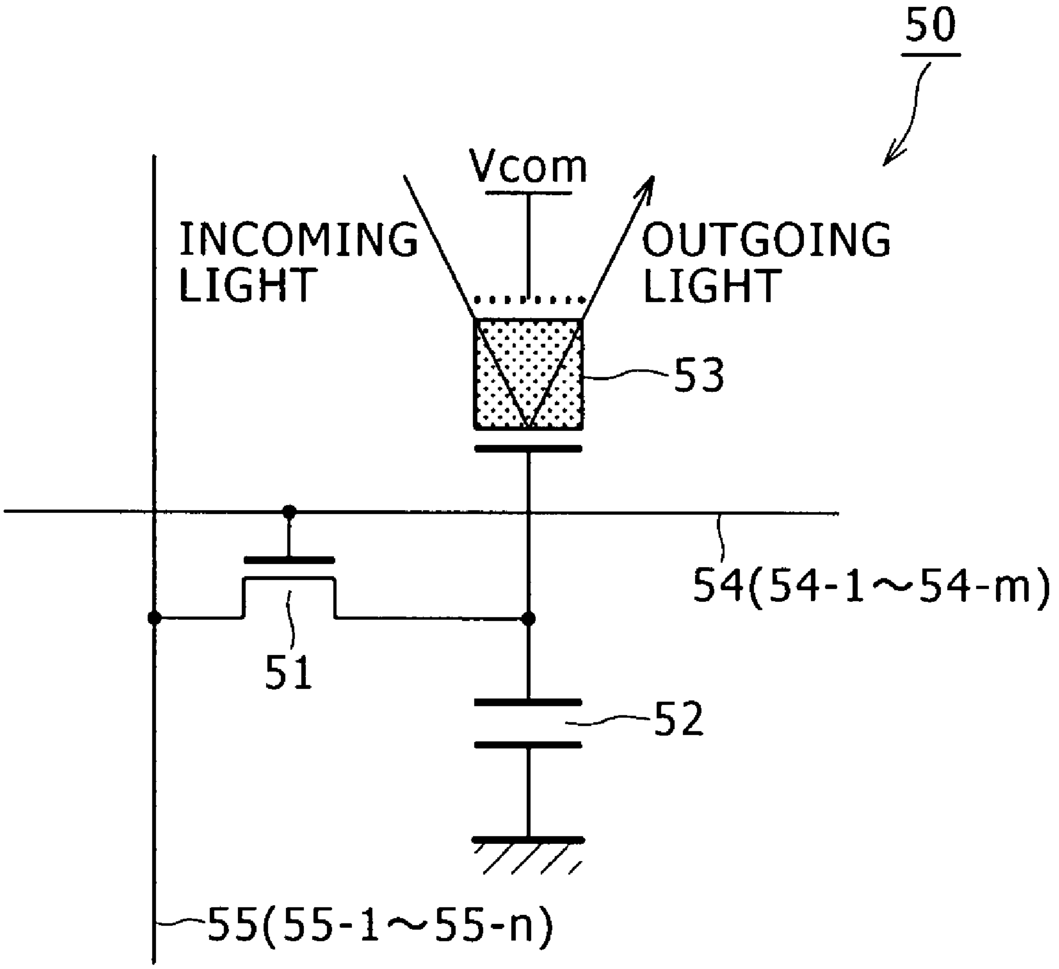
FIG. 2 is a circuit diagram showing an example of a circuit configuration of a unit pixel in the liquid crystal display apparatus.

FIG. 2 shows an example of a circuit configuration of the unit pixel 50. Referring to FIG. 2, the pixel transistor 51 of the unit pixel 50 is connected at the control electrode (gate electrode) thereof to a gate line 54 (54-1 to 54-*m*) and at the input electrode thereof to a data line 55 (55-1 to 55-*n*). The pixel transistor 51 may be formed, for example, from a thin film transistor (TFT).

The capacitive element 52 is connected at a terminal thereof to the output terminal of the pixel transistor 51 and is grounded at the other terminal thereof. The liquid crystal cell 53 signifies liquid crystal capacitance produced between a pixel electrode and an opposing electrode formed in an opposing relationship to the pixel electrode, and is connected at the pixel electrode thereof to the output electrode of the pixel transistor 51. The opposing electrode of the liquid crystal cell 53 is formed from a single transparent electrode which covers the overall display area of the liquid crystal display apparatus 1. A common potential Vcom common to all pixels is applied to the opposing electrode.

In the unit pixel 50, when a voltage is applied to the pixel electrode of the capacitive element 52 from the data line 55 (55-1 to 55-*n*) through the pixel transistor 51, the polarization characteristic of the liquid crystal varies in response to the applied voltage. Consequently, gradation display in accordance with the applied voltage is performed by the capacitive element 52. The applied voltage is retained by the capacitive element 52. Accordingly, also after the pixel transistor 51 is turned off, the reflection amount of the liquid crystal is maintained continuously by the applied voltage retained in the capacitive element 52.

Referring back to FIG. 1, it is assumed that the unit pixels 50 in the odd-numbered pixel columns from among the unit pixels 50 of the pixel array section 10 correspond to a first pixel group while the unit pixels 50 in the even-numbered pixel columns correspond to a second pixel group. Correspondingly, it is assumed that the data lines 55-1, 55-3, . . . connected to the input electrodes of the unit pixels 50 of the first pixel group in the odd-numbered pixel columns correspond to first data lines while the data lines 55-2, 55-4, . . . connected to the input electrodes of the unit pixels 50 of the second pixel group in the even-numbered pixel columns correspond to second data lines.

<Gate Line Drive Circuit>

The gate line drive circuit 20 includes a vertical driver 21. The vertical driver 21 is formed typically from a shift register circuit and successively outputs a vertical scanning signal GATE for selecting the unit pixels 50 of the pixel array section 10 in a unit of a row through the gate lines 54-1 to 54-*m*.

<Data Line Drive Circuit>

The data line drive circuit 30 includes a horizontal driver 31, horizontal selection switches 32-1 to 32-*n*, display signal supplying transistors 33-1 and 33-2, measurement signal supplying transistors 34-1 and 34-2, voltage supply control transistors 35-1 to 35-*n*, and an inverter 36.

The horizontal driver 31 includes, for example, a shift register circuit and a testing logic circuit. When a test signal TEST has a low level which is the ground level, that is, when the liquid crystal display apparatus 1 is in an ordinary operation mode, the shift register operates to successively output first horizontal switch drive signals DSW1 to DSWn for selectively driving the horizontal selection switches 32-1 to 32-*n*. On the other hand, when the test signal TEST has a high level, that is, when the liquid crystal display apparatus 1 is in a test mode, the testing logic circuit operates to output a second horizontal switch drive signal DSW for selectively driving the horizontal selection switches 32-1 to 32-*n* in a unit of a pixel column.

In the ordinary operation mode, the horizontal selection switches 32-1, 32-3, . . . corresponding to the odd-numbered pixel columns from among the horizontal selection switches 32-1 to 32-*n* are connected between the data lines 55-1, 55-3, . . . of the odd-numbered pixel columns and a first signal supply line 37-1. Meanwhile, the horizontal selection switches 32-2, 32-4, . . . corresponding to the even-numbered pixel groups are connected between the data lines 55-2, 55-4, . . . of the even-numbered pixel columns and the second signal supply line 37-2. Then, the horizontal selection switches 32-1, 32-3, . . . and the horizontal selection switches 32-2, 32-4, . . . are placed into an on state in response to the first and second horizontal scanning signals outputted from the horizontal driver 31, respectively.

In the ordinary operation mode, an image displaying signal SIG is supplied commonly to the first and second signal supply lines 37-1 and 37-2 through the display signal supplying transistors 33-1 and 33-2. The display signal supplying transistors 33-1 and 33-2 are placed into an on state when the test signal TEST of the "L" level is applied to the gate electrode thereof through the inverter 36, and supply the image displaying signal SIG commonly to the first and second signal supply lines 37-1 and 37-2.

Meanwhile, in the test mode, a first measurement signal TSIG1 is selectively supplied to the first signal supply line 37-1 through the measurement signal supplying transistor 34-1, and a second measurement signal TSIG2 is selectively supplied to the second signal supply line 37-2 through the measurement signal supplying transistor 34-2. The measurement signal supplying transistors 34-1 and 34-2 are placed into an on state when the test signal TEST of the "H" level is supplied to the gate electrode thereof, and supplies the first and second measurement signals TSIG1 and TSIG2 to the first and second signal supply lines 37-1 and 37-2, respectively.

The voltage supply control transistors 35-1 to 35-*n* are connected between the data lines 55-1 to 55-*n* and a voltage supply line 38, respectively. A predetermined dc voltage Vguard is applied to the voltage supply line 38. The voltage supply control transistors 35-1 to 35-*p* are connected at the gate electrode thereof commonly to a control line 39 and are placed into an on state when a voltage supply control signal TOFF of the "H" level is applied to the gate electrode thereof through the control line 39 to apply the dc voltage Vguard to the data lines 55-1 to 55-*n*.

<Testing Circuit>

The testing circuit 40 includes switch circuits 41-1 to 41-*p*, sense amplifiers 42-1 to 42-*p*, and a decoder 43.

The switch circuits 41-1 to 41-*p* are disposed such that two adjacent ones such as the two data lines 55-1 and 55-2, 55-3 and 55-4, . . . are paired with each other. Accordingly, the number p of the switch circuits 41-1 to 41-*p* is one half the number n of the data lines 55-1 to 55-*n*. Since the switch circuits 41-1 to 41-*p* have the same circuit configuration, a particular circuit configuration thereof is described taking the first switch circuit 41-1 as an example.

The switch circuit 41-1 includes switches 44 and 45 connected at one contact thereof to one end of the data lines 55-1 and 55-2, respectively, and a further switch 46 connected between the other contacts of the switches 44 and 45. The switches 44 and 45 are placed into an on (closed) state when a switch control signal SWA of the "H" level is applied thereto to connect the negated input terminal and the non-negated terminal of the sensor amplifier 42-1 with low impedance to the data lines 55-1 and 55-2, respectively.

The switch 46 has a function as data line tank means for being placed, when a switch control signal SWB of the "H" level is applied thereto, into an on (closed) state to short-circuit the data lines 55-1 and 55-2 with low impedance. When the data lines 55-1 and 55-2 are short-circuited by the switch 46, where there is a potential difference between the data lines 55-1 and 55-2, the potentials at the data lines 55-1 and 55-2, that is, the potentials at the negated input terminal and the non-negated input terminal of the sensor amplifier 42-1, becomes an equal potential, more particularly, becomes a middle potential between the potentials at the data lines 55-1 and 55-2 prior to the short-circuiting.

Since the switch 46 acts to short-circuit the data lines 55-1 and 55-2 in this manner, the location of the switch 46 is not limited to that between the switches 44 and 45 and the sensor amplifier 42-1. However, where the switch 46 is disposed at a position nearer to the sensor amplifier 42-1, there is an advantage that the potentials at the negated input terminal and the non-negated input terminal of the sensor amplifier 42-1 can be made equal to each other without being influenced by the parasitic capacitance and wiring line resistance of the data lines 55-1 and 55-2.

The sensor amplifier 42-1 compares the potentials at the data lines 55-1 and 55-2 with each other in synchronism with an enable signal EN when the switches 44 and 45 of the switch circuit 41-1 are in an on state to detect the potential difference and amplifies and outputs the potential difference. Also the sense amplifiers 42-2 to 42-*p* perform operation similar to that of the sensor amplifier 42-1. The sense amplifiers 42-1 to 42-*p* are a comparison circuit for comparing the potentials at the odd-numbered data lines 55-1, 55-3, . . . which are the first data lines and the potentials at the even-numbered data lines 55-2, 55-4, . . . which are the second data lines with each other. However, the comparison circuit is not limited to the sense amplifiers 42-1 to 42-*p* but may be any comparison circuit if it can compare the potentials at the first data lines and the potentials at the second data lines with each other.

A detection signal of the "H" level or the "L" level is outputted from each of the sense amplifiers 42-1 to 42-*p* and inputted to the decoder 43. The decoder 43 retains the detection signals supplied from the sense amplifiers 42-1 to 42-*p* once and compares the retained detection signals with an expected value. Then, the decoder 43 outputs a test result signal TOUT which indicates that the test result is good or non-defective (OK) when the retained detection signals satisfy the expected value but indicates that the test result is not good or is defective (NG) when the regained detection signals do not satisfy the expected value.

<Sensor Amplifier and Decoder>

Figure 3:
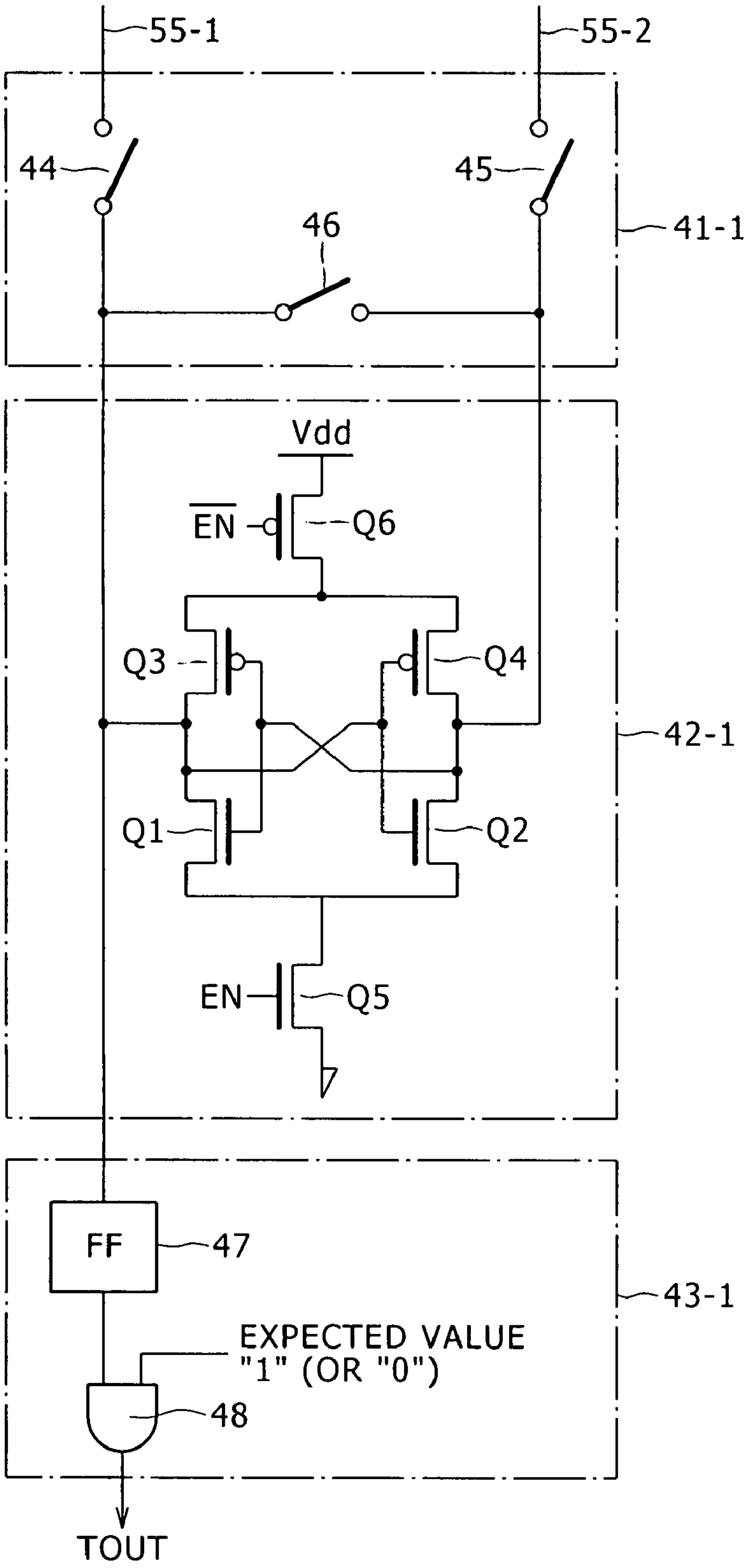
FIG. 3 is a circuit diagram showing a particular example of a first sense amplifier and a corresponding circuit portion of a decoder in the liquid crystal display apparatus.

FIG. 3 shows a particular example of, for example, the first sensor amplifier 42-1 and a corresponding circuit portion of the decoder 43.

As seen in FIG. 3, the sensor amplifier 42-1 includes a pair of N-channel differential pair transistors Q1 and Q2 having the source electrodes connected commonly to perform a differential operation, and a pair of P-channel load transistors Q3 and Q4 having the drain electrodes connected to the drain electrodes of the differential pair transistors Q1 and Q2, respectively. The sensor amplifier 42-1 further includes an N-channel current source transistor Q5 connected the node of the common connection of the source electrodes of the differential pair transistors Q1 and Q2 and the ground, and a P-channel current source transistor Q6 connected between the node of the common connection of the source electrodes of the load transistors Q3 and Q4 and a power supply Vdd.

The gate electrodes of the transistors Q1 and Q3 are connected commonly to each other and also to the drain common connection node of the transistors Q2 and Q4. The gate electrodes of the transistors Q2 and Q4 are connected commonly to each other and also to the drain common connection node of the transistors Q1 and Q3. The drain common connection node of the transistors Q1 and Q3 is connected to the other contact of the switch 44 while the drain common connection node of the transistors Q2 and Q4 is connected to the other contact of the switch 45. The enable signal EN is applied to the gate electrode of the current source transistor Q5. An inverted signal of the enable signal EN is applied to the gate electrode of the current source transistor Q6.

The circuit portion 43-1 of the decoder 43 corresponding to the sensor amplifier 42-1 includes a flip-flop (FF) 47 and a 2-input AND gate 48. The flip-flop 47 temporarily retains a detection signal of the "H" level (logic "1") or the "L" level (logic "0") supplied thereto from the sensor amplifier 42-1. The 2-input AND gate 48 compares the logic "1" or "0" which is the stored contents of the flip-flop 47 with an expected value "1" (or "0"). Then, the 2-input AND gate 48 outputs a test result signal TOUT of a binary value ("H" level/"L" level) in accordance with a result of the comparison. In particular, if the logic values of the two inputs coincide with each other, that is, if the stored contents of the flip-flop 47 are equal to the expected value, then the test result signal TOUT representing that the test result is good (OK) is outputted. However, if the logic values of the two inputs do not coincide with each other, that is, if the stored contents of the flip-flop 47 are not equal to the expected value, then the test result signal TOUT representing the test result is not good (NG) is outputted.

[Test of the Liquid Crystal Display Apparatus]

A testing method for the pixel array section 10 of the liquid crystal display apparatus 1 according to the embodiment of the present invention having the configuration described above, particularly testing of the quality of the unit pixels 50 and of the gate lines 54-1 to 54-*m* and data lines 55-1 to 55-*n* in regard to short-circuiting, disconnection and so forth, is particularly described below. It is to be noted that testing of the unit pixels 50 in regard to the quality, that is, in regard to whether or not they are defective, includes testing of the quality of the capacitance elements 52 and testing of the quality of the liquid crystal cells 53. The tests are performed using a well-known LSI tester.

Figure 4:
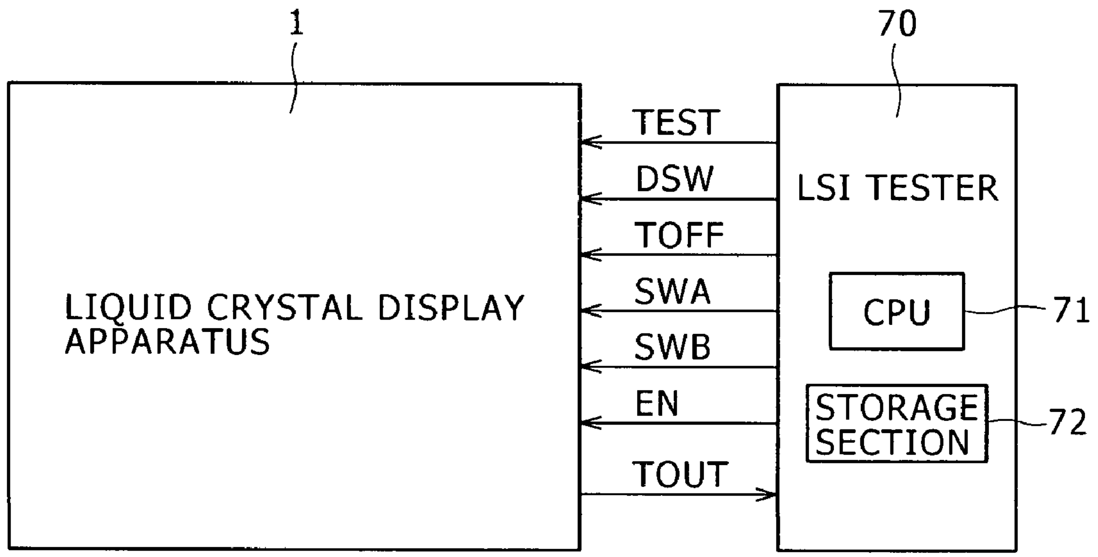
FIG. 4 is a block diagram showing a connection scheme between the liquid crystal display apparatus and an LSI tester.

FIG. 4 illustrates a relationship between the liquid crystal display apparatus 1 and an LSI tester 70. In the present embodiment, various control signals are inputted from the LSI tester 70 to the liquid crystal display apparatus 1. The control signals include a test signal TEST, first and second measurement signals TSIG1 and TSIG2 and a voltage supply control signal TOFF which are used in the data line drive circuit 30 and switch control signals SWA and SWB and an enable signal EN which are used in the testing circuit 40. Meanwhile, a test result signal TOUT is inputted from the liquid crystal display apparatus 1 to the LSI tester 70. Thus, the LSI tester 70 decides, based on the test result signal TOUT, whether or not the unit pixel 50 is good and whether or not there exists short-circuiting, disconnection or the like in the gate lines 54-1 to 54-*m* and the data lines 55-1 to 55-*n*.

The LSI tester 70 includes a CPU (Central Processing Unit) 71, a storage section 72 and so forth provided therein. The CPU 71 reads out and executes a test program stored in the storage section 72 or the like to execute a function described below, that is, a function of testing the unit pixels 50 in regard to the quality and the gate lines 54-1 to 54-*m* and the data lines 55-1 to 55-*n* in regard to short-circuiting, disconnection and so forth.

Here, it is presupposed that the test program is stored in advance in the storage section 72 or the like. However, it is otherwise possible to provide the test program through a communication unit so that the test program is read into the storage section 72 or to record the test program in a recording medium such as a CD-ROM such that it is read into the storage section 72 through a recording medium driver (not shown) of the LSI tester 70.

It is to be noted that the test of the unit pixels 50 in regard to the quality or of the gate lines 54-1 to 54-*m* and the data lines 55-1 to 55-*n* in regard to short-circuiting, disconnection and so forth is performed at a stage before liquid crystal is filled in the fabrication process. However, the test of the liquid crystal cell 53 in regard to the quality is performed at a stage after liquid crystal is filled. In both cases, the process of testing is basically same.

In the following, a series of measuring operations executed under the control of the CPU 71 of the LSI tester 70 for testing the unit pixels 50 in regard to the quality or testing the gate lines 54-1 to 54-*m* and the data lines 55-1 to 55-*n* in regard to short-circuiting, disconnection and so forth is described with reference to FIGS. 5 and 6.

It is to be noted that the series of measuring operations by the CPU 71 is executed for a pair of adjacent pixel columns in a unit of a pixel row in synchronism with vertical scanning by the vertical driver 21. Here, in order to facilitate understandings, the series of measuring operations is described taking a case wherein it is performed for a pair of unit pixels 50*i*-1 and 50*i*-2 in the first and second columns in a certain pixel row i as an example.

Figure 5:
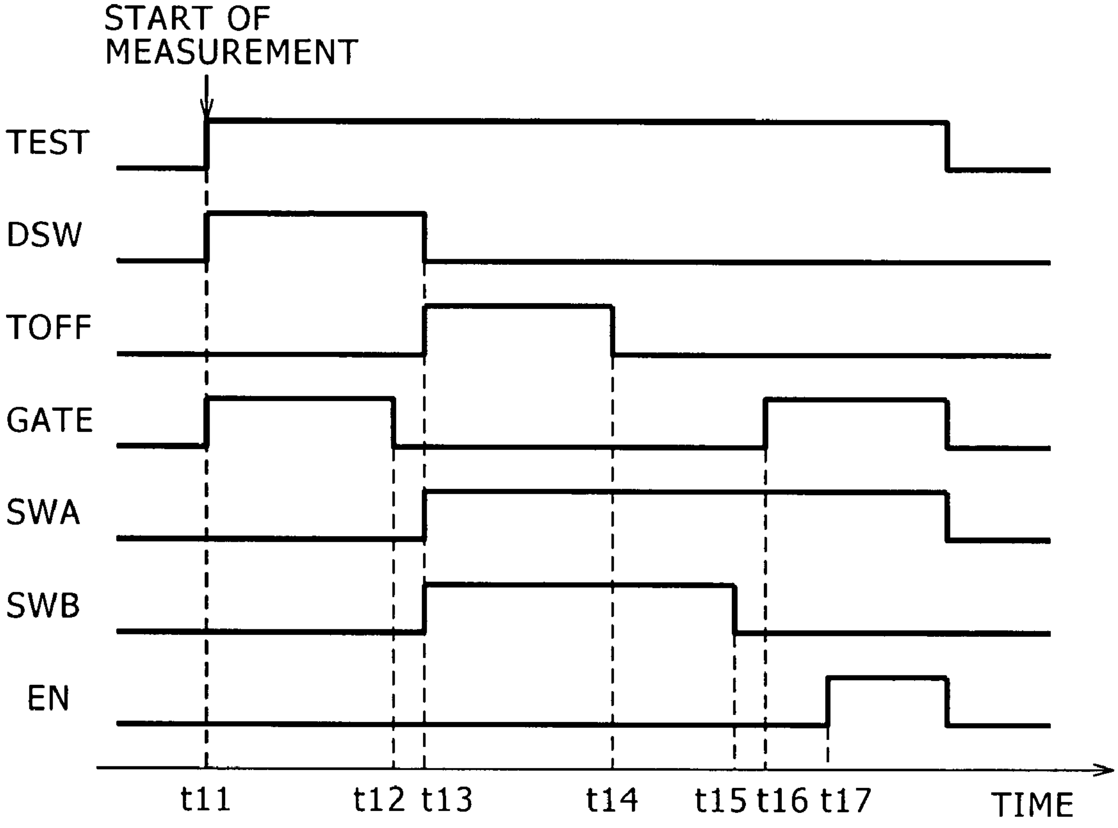
FIG. 5 is a timing chart illustrating a series of measuring operations for the testing of the liquid crystal display apparatus.
Figure 6:
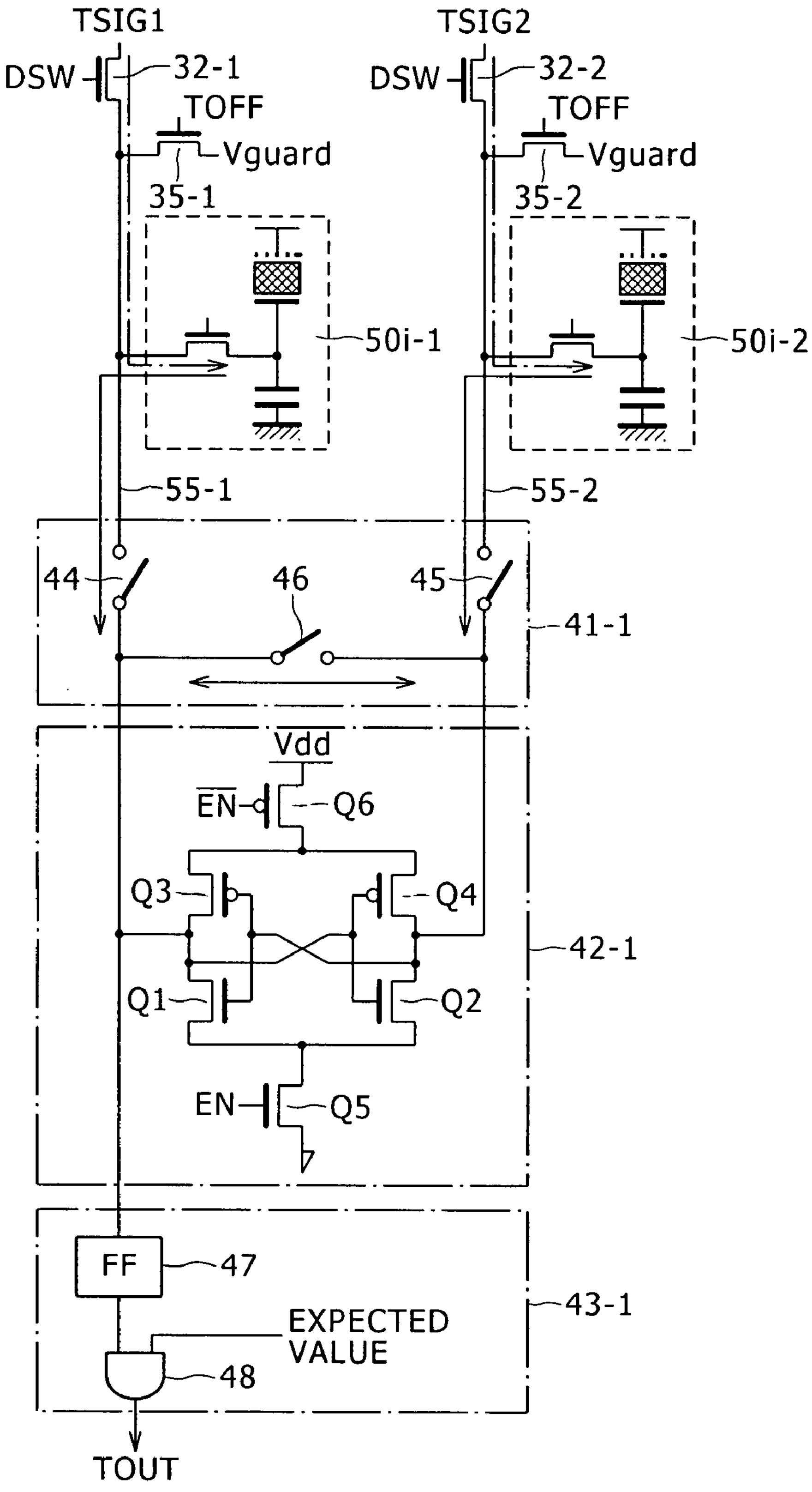
FIG. 6 is a circuit diagram illustrating the series of measuring operations for the testing of the liquid crystal display apparatus.

In the timing chart of FIG. 5, a timing relationship among the test signal TEST, horizontal switch drive signal DSW, voltage supply control signal TOFF, vertical scanning signal GATE, switch control signals SWA and SWB and enable signal EN. The signals mentioned are all in the "L" level state before the measurement is started.

First, the LSI tester 70 sets the test signal TEST to the "H" level and supplies the first and second measurement signals TSIG1 and TSIG2 to the liquid crystal display apparatus 1 at time t11. When the test signal TEST changes over to the "H" level, the measurement signal supplying transistors 34-1 and 34-2 are placed into an on state so that the first and second measurement signals TSIG1 and TSIG2 are supplied to the first and second signal supply lines 37-1 and 37-2, respectively.

Further, when the test signal TEST changes over to the "H" level, the horizontal driver 31 changes over the second horizontal switch drive signal DSW common to the horizontal selection switches 32-1 and 32-2 to the "H" level to place the horizontal selection switches 32-1 and 32-2 into an on state. Consequently, the first and second measurement signals TSIG1 and TSIG2 are applied from the first and second signal supply lines 37-1 and 37-2 to the data lines 55-1 and 55-2 through the horizontal selection switches 32-1 and 32-2, respectively.

Simultaneously with the application of the first and second measurement signals TSIG1 and TSIG2 to the data lines 55-1 and 55-2 (time t11), the vertical scanning signal GATE of the "H" level is applied from the vertical driver 21 to the gate line 54-*i* of the pixel row i by vertical scanning by the vertical driver 21. Consequently, the pixel transistors 51 of the unit pixels 50*i*-1 and 50*i*-2 are placed into an on state, and as a result, the first and second measurement signals TSIG1 and TSIG2 are applied to the respective capacitance elements 52 through the pixel transistors 51.

It is assumed that the voltage level of the first measurement signal TSIG1 is, for example, 5.0 V and the voltage level of the second measurement signal TSIG2 is, for example, 4.0 V. It is to be noted that the voltage levels mentioned are a mere example and are not restrictive values. Further, the first and second measurement signals TSIG1 and TSIG2 are analog signals of dc voltages.

When the first and second measurement signals TSIG1 and TSIG2 are applied to the capacitance elements 52 of the unit pixels 50*i*-1 and 50*i*-2, respectively, the unit pixels 50*i*-1 and 50*i*-2 are charged in accordance with the first and second measurement signals TSIG1 and TSIG2, respectively. Then, the voltage levels of the first and second measurement signals TSIG1 and TSIG2 are retained in the capacitance elements 52. The voltage levels of the first and second measurement signals TSIG1 and TSIG2 are written into the unit pixels 50*i*-1 and 50*i*-2 in this manner.

After the voltage levels of the first and second measurement signals TSIG1 and TSIG2 are written into the unit pixels 50*i*-1 and 50*i*-2, respectively, the vertical scanning signal GATE to be outputted from the vertical driver 21 to the ith pixel row is changed over from the "H" level to the "L" level at time t12. In response to the changeover of the vertical scanning signal GATE, the pixel transistors 51 of the unit pixels 50*i*-1 and 50*i*-2 are placed into an off state and the charge amounts stored in the capacitance elements 52 are settled.

Thereafter, the horizontal driver 31 changes over the second horizontal switch drive signal DSW to the "L" level at time t13 to place the horizontal selection switches 32-1 and 32-2 into an off state thereby to stop the application of the first and second measurement signals TSIG1 and TSIG2 to the data lines 55-1 and 55-2.

Simultaneously at time t13, the LSI tester 70 changes over the voltage supply control signal TOFF and the switch control signals SWA and SWB to the "H" level. Consequently, the voltage supply control transistors 35-1 to 35-*n* are placed into an on state. As a result, the predetermined dc voltage Vguard is applied to the data lines 55-1 and 55-2, and the switches 44 and 45 of the switch circuit 41-1 are placed into an on state so that the dc voltage Vguard is applied to the negated input terminal and the non-negated input terminal of the sensor amplifier 42-1. Here, the dc voltage Vguard is, for example, 3.0 V.

Further, the switch 46 is placed into an off state to short-circuit the data lines 55-1 and 55-2 and hence short-circuit the negated input terminal and the non-negated input terminal of the sensor amplifier 42-1 thereby to perform an equalization operation of equalizing the potentials at the data lines 55-1 and 55-2 and the potentials at the negated input terminal and the non-negated input terminal of the sensor amplifier 42-1 to the same potential, that is, to the same dc voltage Vguard.

At time t14 after the potentials at the different portions of the circuit, that is, the potentials at the data lines 55-1 and 55-2 and the negated input terminal and the non-negated input terminal of the sensor amplifier 42-1, are substantially fixed (equalized) by the equalization operation just described, the LSI tester 70 changes over the voltage supply control signal TOFF to the "L" level to place the voltage supply control transistors 35-1 to 35-*n* into an off state. Consequently, the application of the dc voltage Vguard to the data lines 55-1 and 55-2 is stopped, and in this state, a more accurate equalization operation of the potentials in the circuit is performed by an action of the switch 46.

As a result of such an equalization operation as described above, the potentials at the negated input terminal and the non-negated input terminal of the sensor amplifier 42-1 become equal to each other. Therefore, when the potentials at the data lines 55-1 and 55-2 are to be compared subsequently by the sensor amplifier 42-1, the comparison operation can be performed accurately.

At time t15 after the equalization operation is completed, the LSI tester 70 changes over the switch control signal SWB to the "L" level to place the switch 46 of the switch circuit 41-1 into an off state. Consequently, the data line 55-1 and the data line 55-2 are electrically isolated from each other, and the negated input terminal and the non-negated input terminal of the sensor amplifier 42-1 are electrically isolated from each other.

Then at time t16, the vertical scanning signal GATE of the "H" level is applied to the gate line 54-*i* of the pixel row i from the vertical driver 21 by second time vertical scanning by the vertical driver 21. Consequently, the pixel transistors 51 of the unit pixels 50*i*-1 and 50*i*-2 are placed into an on state, and as a result, the retained voltages of the capacitance elements 52 are applied to the two data lines 55-1 and 55-2 paired with each other through the pixel transistors 51.

The data lines 55-1 and 55-2 have a capacitance component. It is assumed here that, in the present embodiment, the capacitance value of the data line 55-1 and the capacitance value of the data line 55-2 are equal to each other and are represented by Cdata. Further, the capacitance value Cdata of the data lines 55-1 and 55-2 is very high when compared with the capacitance value Cs of the capacitive element 52. As an example, Cs:Cdata=1:100. In other words, the capacitance value Cdata of the data lines 55-1 and 55-2 is equal to 100 times the capacitance value Cs of the capacitive element 52.

As a result of the equalization operation, 3.0 V (Vguard) is retained in the capacitance components of the data lines 55-1 and 55-2. If, in this state, the retained voltages of the capacitance elements 52 of the unit pixels 50*i*-1 and 50*i*-2 are read out to the data lines 55-1 and 55-2, then since the retained voltage of the capacitive element 52 of the unit pixel 50*i*-1 is 5.0 V and the retained voltage of the capacitive element 52 of the unit pixel 50*i*-2 is 4.0 V, the potential at the data line 55-1 changes to 3.05 V and the potential at the data line 55-2 changes to 3.04 V from the capacitance ratio between the capacitance value Cdata of the data lines 55-1 and 55-2 and the capacitance value Cs of the capacitive element 52 (from Q=C·V, the charge of the data line 55-1 is given by 305·Cs and the charge of the data line 55-2 is given by 304·Cs).

Thereafter, at time t17 after the potentials at the two data lines 55-1 and 55-2 paired with each other are settled, the LSI tester 70 changes over the enable signal EN to the "H" level to place the current source transistors Q5 and Q6 (refer to FIG. 3) in the sensor amplifier 42-1 into an on state. As a result, the sensor amplifier 42-1 enters an activated state and compares the potential at the data line 55-1 and the potential at the data line 55-2 with each other.

In the example described above, the potential 3.05 V of the data line 55-1 is applied to the non-negated input terminal of the sensor amplifier 42-1 while the potential 3.04 V of the data line 55-2 is applied to the negated input terminal of the sensor amplifier 42-1. At this time, the potential difference 0.01 V between the potential 3.05 V of the data line 55-1 and the potential 3.04 V of the data line 55-2 is amplified up to the power supply Vdd and then applied as a comparison result of the logic "1" to the decoder 43, particularly to the circuit portion 43-1 corresponding to the sensor amplifier 42-1.

The potential difference between the data lines 55-1 and 55-2 arises from the capacitance difference between the capacitance value Cs of the capacitance elements 52 of the unit pixels 50*i*-1 and 50*i*-2 and the capacitance value Cdata of the data lines 55-1 and 55-2, which should originally be equal to each other. Then, if the capacitive element 52 of the unit pixel 50*i*-1 becomes defective and the capacitance value Cs becomes lower by more than 20%, then the potential at the data line 55-1 becomes lower than 3.04 V, but if the capacitive element 52 of the unit pixel 50*i*-2 becomes defective and the capacitance value Cs of the capacitive element 52 becomes higher by more than 20%, then the potential at the unit pixel 50*i*-2 becomes higher than 3.05 V. In other words, the relationship in magnitude between the potentials of the data lines 55-1 and 55-2 is reversed. At this time, the sensor amplifier 42-1 outputs the potential difference between the data lines 55-1 and 55-2 as a comparison result of the logic "0" to the circuit portion 43-1 of the decoder 43.

The circuit portion 43-1 of the decoder 43 decides whether or not the comparison result of the sensor amplifier 42-1 coincides with the expected value "1" which represents that the capacitance elements 52 of the unit pixels 50*i*-1 and 50*i*-2 are normal. Then, the circuit portion 43-1 outputs a result of the decision as a test result signal TOUT to the LSI tester 70. When the capacitance elements 52 of the unit pixels 50*i*-1 and 50*i*-2 are normal or non-defective, since the comparison result of the sensor amplifier 42-1 exhibits the logic "1", the test result signal TOUT of the output of the 2-input AND gate 48 exhibits the "H" level (logic "1"). On the other hand, when one of the capacitance elements 52 of the unit pixels 50*i*-1 and 50*i*-2 is abnormal or defective, the comparison result of the sensor amplifier 42-1 exhibits the logic "0", and therefore, the test result signal TOUT exhibits the "L" level (logic "0").

The LSI tester 70 receives the test result signal TOUT from the decoder 43 and can test the capacitive element 52 in regard to the quality for each two unit pixels adjacent each other in a unit of a pixel row with regard to all of the unit pixels 50.

It is to be noted that, while, in the example described above, the voltage level of the first measurement signal TSIG1 is set higher than the voltage level of the second measurement signal TSIG2, it is otherwise possible to reversely set the relationship in magnitude between the voltage levels of the first and second measurement signals TSIG1 and TSIG2. In this instance, the expected value when the capacitance elements 52 of the unit pixels 50*i*-1 and 50*i*-2 are normal is set to the logic "0" by the decoder 43. In other words, the expected value "1"/"0" is determined from the first and second measurement signals TSIG1 and TSIG2 to be applied to the data lines 55-1 and 55-2 paired with each other.

Also it is possible to additionally provide a circuit for changing over the voltage level of the first measurement signal TSIG1 and the voltage level of the second measurement signal TSIG2. In this instance, two different tests can be performed. In particular, one of the tests is performed by supplying the voltage level of the first measurement signal TSIG1 to the data line 55-1 while the voltage level of the second measurement signal TSIG2 is supplied to the data line 55-2. The other one of the tests is performed by supplying the voltage level of the second measurement signal TSIG2 to the data line 55-1 while the voltage level of the first measurement signal TSIG1 is supplied to the data line 55-2. Where the configuration just described is adopted, it can be decided with a higher degree of certainty which one of the unit pixels 50 of the unit pixels 50*i*-1 and 50*i*-2 is defective.

By executing the series of measuring operations described above as a test at a stage prior to filling of liquid crystal, it is possible to test the capacitance elements 52 of the unit pixels 50 in regard to the quality (normal/abnormal or non-defective/defective) as described above.

Further, when, in a test at a stage prior to filling of liquid crystal, the series of measuring operations is performed for each pixel row to write the voltage levels of the first and second measurement signals TSIG1 and TSIG2 into two adjacent unit pixels in each pixel row, if a unit pixel into which a corresponding voltage level cannot be written is found, then it can be detected that the data line of the pixel row including the unit pixel into which the voltage level cannot be written suffers from short-circuiting or disconnection.

As regards the location where short-circuiting or disconnection occurs with the data line, since the operation of writing the voltage levels of the first and second measurement signals TSIG1 and TSIG2 is performed in a unit of a pixel row in synchronism with vertical scanning by the vertical driver 21, the position of the pixel low in which the unit pixel into which the voltage level cannot be written is found can be detected as the location where short-circuiting or disconnection occurs with the data line.

Further, in the test at the stage prior to the filling of liquid crystal, while it is presupposed that the data lines 55-1 to 55-*n* are normal, the series of measuring operations described above may be performed not for each pixel row for each two adjacent pixel columns paired with each other among all pixel columns but for each pixel row for each two adjacent pixel columns paired with each other in a unit of pixel columns in a group where all pixel rows are divided into a plurality of groups. In this instance, if a unit pixel into which a voltage level cannot be written is found when the voltage levels of the first and second measurement signals TSIG1 and TSIG2 are written into the unit pixels 50, then since this signifies that the pixel transistor 51 cannot be turned on by the vertical scanning signal GATE, it can be detected that the gate line of the pixel row including the unit pixel into which the voltage cannot be written suffers from short-circuiting or disconnection.

As an example, it is assumed that the number of pixel columns is 1,920, that is, the number of pixels in the horizontal direction is 1,920 and the totaling 1,920 pixel columns are divided in a unit of 48 pixel columns into 40 regions. In this instance, the series of measuring operations is executed for each pixel row for each two adjacent pixel columns paired with each other for each of the divisional regions by totaling 40 times. By this, a location at which short-circuiting or disconnection occurs with the gate lines 54-1 to 54-*m* can be detected for each of the 40 regions.

On the other hand, where it is presupposed that the capacitance elements 52 of all of the unit pixels 50, all of the data lines 55-1 to 55-*n* and all of the gate lines 54-1 to 54-*m* are normal, if the series of measuring operations described above is performed for each pixel row in a test at a stage after filling of liquid crystal, then it is possible to perform a test regarding the quality of other elements than the capacitance elements 42 of the unit pixels 50.

In particular, if liquid crystal is not filled in a prescribed manner or some foreign article is mixed into liquid crystal or else the pattern of a pixel electrode is distorted, then the capacitance value Cs of the capacitive element 52 varies. Accordingly, if some abnormality is detected by the series of measuring operations described above, then since the capacitive element 52 is normal, it is decided that the unit pixel 50 is abnormal at some portion thereof other than the capacitive element 52, that is, the unit pixel 50 is abnormal in that the liquid crystal is not filled in a prescribed manner or some foreign article is mixed in the liquid crystal or the pattern of the pixel electrode is distorted.

As described above, before the first measurement signal TSIG1 is read out from the unit pixels of the first pixel group (in the example described above, the pixel group of the first column) into the data line 55-1 and the second measurement signal TSIG2 is read out from the unit pixels 50 of the second pixel group (in the example described above, the pixel group of the second column) into the data line 55-2, the predetermined dc voltage Vguard is supplied to the first and second data lines 55-1 and 55-2 and besides the first data line 55-1 and the second data line 55-2 are short-circuited by the switch 46, the potentials at the data lines 55-1 and 55-2 become equal to each other.

Since, in the state wherein the potentials at the data lines 55-1 and 55-2 are equal to each other, the first and second measurement signals TSIG1 and TSIG2 are read out from the unit pixels 50 of the first and second pixel groups into the data lines 55-1 and 55-2 and the potentials at the data lines 55-1 and 55-2 paired with each other are compared with each other, the comparison operation can be performed accurately.

Particularly, the testing method according to the present embodiment is different from the method of measuring leak current in that, after the first and second measurement signals TSIG1 and TSIG2 having different voltage values from each other are written into unit pixels paired with each other, the predetermined dc voltage Vguard is applied to the data lines 55-1 and 55-2 paired with each other and the data lines 55-1 and 55-2 are short-circuited to each other to perform an equalization operation, whereafter the voltages retained in the paired unit pixels are read out into the data lines 55-1 and 55-2 and compared with each other. Therefore, even in a reflection type liquid crystal display apparatus such as a LCOS liquid crystal apparatus wherein the capacitance value Cs of the capacitive element 52 is approximately several tens FF, the test can be performed with certainty.

Further, since the switches 44 and 45 for selectively cutting electric connection between the testing unit and the data lines 55-1 and 55-2 are provided at the input stage of the testing circuit 40, a writing operation of the first and second measurement signals TSIG1 and TSIG2 into the unit pixels 50 and a testing operation by the testing circuit 40 can be performed concurrently. Therefore, the processing time required for the test can be reduced.

Further, where the switch 46 serving as data line short-circuiting means is interposed between the switches 44 and 45 and the switch circuit 41-1, since the location of the switch 46 is comparatively near to the sensor amplifier 42-1, the potentials at the negated input terminal and the non-negated input terminal of the sensor amplifier 42-1 can be made equal to each other without being influenced by the parasitic capacitance and the wiring line resistance of the data lines 55-1 and 55-2.

It should be understood by those skilled in the art that various modifications, combinations, sub-combinations and alterations may occur depending on design requirements and other factors insofar as they are within the scope of the appended claims or the equivalents thereof

What is claimed is:

1. A liquid crystal display apparatus, comprising:

a pixel array section including a plurality of unit pixels disposed in a matrix and each unit pixel including a pixel transistor, a capacitive element connected to an output electrode of said pixel transistor and a liquid crystal cell configured to display a gradation in accordance with a voltage retained in said capacitive element;

a first data line connected to an input electrode of each unit pixel of first pixel group in a unit of a pixel column from among the unit pixels of said pixel array section;

a second data line connected to an input electrode of each unit pixel of second pixel group in a unit of a pixel column from among the unit pixels of said pixel array section;

a writing unit configured to write a first measurement signal into the unit pixels of the first pixel group through the first data line and writing a second measurement signal into the unit pixels of the second pixel group through the second data lines line;

a voltage supply control unit configured to selectively supply a predetermined dc voltage to the first and second data lines;

a data line short-circuiting unit configured to short-circuit the first data line and the second data line after the voltage supplied by said voltage supply control unit;

a reading out unit configured to read out the first and second measurement signals from the unit pixels of the first and second pixel groups into the first and second data lines, respectively, after the first and second data lines are short-circuited to each other by said data line short-circuiting unit; and a testing unit configured to compare the potential at the first data lines line and the potential at the second data line with each other after the reading out by said reading out unit and performing a test of said pixel array section based on a result of the comparison.

2. The liquid crystal display apparatus according to claim 1, further comprising a switch unit provided at an input stage of said testing unit configured to selectively cut an electric connection between said testing unit and the first and second data lines.

3. The liquid crystal display apparatus according to claim 2, wherein said data line short-circuiting unit is provided between said switch unit and said testing unit.

4. The liquid crystal display apparatus according to claim 1, wherein said testing unit includes:

a comparison unit configured to compare the potential at the first data line and the potential at the second data line with each other after the reading out by said reading out unit; and a decision unit configured to decide whether or not a result of the comparison by said comparison unit coincides with an expected value estimated from the first and second measurement signals.

5. A testing method for a liquid crystal display apparatus which includes a pixel array section including a plurality of unit pixels disposed in a matrix and each unit pixel including a pixel transistor, a capacitive element connected to an output electrode of said pixel transistor and a liquid crystal cell configured to display a gradation in accordance with a voltage retained in said capacitive element, a first data line connected to an input electrode of each unit pixel of first pixel group in a unit of a pixel column from among the unit pixels of said pixel array section, and a second data line connected to an input electrode of each unit pixel of second pixel group in a unit of a pixel column from among the unit pixels of said pixel array section comprising the steps of:

writing a first measurement signal into the unit pixels of the first pixel groups group through the first data line and writing a second measurement signal into the unit pixels of the second pixel group through the second data lines line;

selectively supplying a predetermined dc voltage to the first and second data lines after the first and second measurement signals are written at the writing step;

short-circuiting the first data line and the second data line after the voltage supplied at the voltage supply control step;

reading out the first and second measurement signals from the unit pixels of the first and second pixel groups into the first and second data lines, respectively, after the first and second data lines are short-circuited to each other at the short-circuiting step; and testing by comparing the potential at the first data line and the potential at the second data line with each other after the reading out at the reading out step and performing a test of said pixel array section based on a result of the comparison.

6. The testing method for a liquid crystal display apparatus according to claim 5, wherein the series of operations at the writing step, voltage supply step, short-circuiting step, reading out step and testing step is performed for each pixel row for each two adjacent pixel columns paired with each other in a unit of a division where all of the pixel columns of said pixel array section are divided into a plurality of divisions.

* * * * *